(12) United States Patent
Huang et al.

(10) Patent No.: US 10,204,736 B2
(45) Date of Patent: Feb. 12, 2019

(54) METHOD FOR MANUFACTURING WIRELESS CHARGING DEVICE

(71) Applicant: JJPLUS CORP., New Taipei (TW)

(72) Inventors: Ching-Hsing Huang, New Taipei (TW); Cheng-Chung Lee, New Taipei (TW)

(73) Assignee: JJPLUS CORP., New Taipei (TW)

( * ) Notice: Subject to any disclaimer, the term of this patent is extended or adjusted under 35 U.S.C. 154(b) by 136 days.

(21) Appl. No.: 15/194,565

(22) Filed: Jun. 28, 2016

(65) Prior Publication Data
US 2017/0229238 A1    Aug. 10, 2017

(30) Foreign Application Priority Data
Feb. 5, 2016  (TW) .............................. 105104082 A

(51) Int. Cl.
| | |
|---|---|
| *H01F 7/06* | (2006.01) |
| *H01F 41/04* | (2006.01) |
| *H02J 7/02* | (2016.01) |
| *H05K 3/32* | (2006.01) |
| *H01F 27/28* | (2006.01) |
| *H01F 27/30* | (2006.01) |
| *H01F 38/14* | (2006.01) |

(52) U.S. Cl.
CPC ....... *H01F 41/041* (2013.01); *H01F 27/2847* (2013.01); *H01F 27/303* (2013.01); *H01F 41/04* (2013.01); *H02J 7/025* (2013.01); *H05K 3/32* (2013.01); *H01F 38/14* (2013.01)

(58) Field of Classification Search
CPC .... H01F 27/2847; H01F 27/303; H01F 38/14; H01F 41/041; H02J 7/025; H05K 3/32
See application file for complete search history.

(56) References Cited

U.S. PATENT DOCUMENTS

| | | | | |
|---|---|---|---|---|
| 2,584,592 | A  * | 2/1952 | Heinz | H01F 27/008 29/829 |
| 7,952,322 | B2 * | 5/2011 | Partovi | H01F 5/003 320/108 |
| 9,209,627 | B2 * | 12/2015 | Baarman | H01F 17/0013 |
| 9,325,187 | B2 * | 4/2016 | Lee | H02J 7/0052 |
| 9,449,754 | B2 * | 9/2016 | Graham | H01F 27/2823 |
| 9,762,083 | B2 * | 9/2017 | Nam | H02J 7/025 |
| 2012/0049991 | A1 | 3/2012 | Baarman et al. | |

(Continued)

FOREIGN PATENT DOCUMENTS

| | | |
|---|---|---|
| TW | M433676 U1 | 7/2012 |
| TW | M493705 U | 1/2015 |
| TW | M511158 U | 10/2015 |

*Primary Examiner* — Paul D Kim
(74) *Attorney, Agent, or Firm* — Hauptman Ham, LLP

(57) ABSTRACT

A method for manufacturing a wireless charging device is disclosed. The method includes: providing a substrate, a first metal plate, and a second metal plate; forming a plurality of circles of slots, each of the circles of slots including at least one first slot and at least one second slot, the at least one first slot having a first depth, and the at least one second slot having a second depth; forming a first coil and a second coil by performing a metal forming process on the first metal plate and the second metal plate; and placing the first coil in the at least one first slot, and placing the second coil in the at least one second slot. In the method, the first coil and the second coil have good fixity and are easily to be assembled.

10 Claims, 13 Drawing Sheets

(56) References Cited

U.S. PATENT DOCUMENTS

2015/0054457 A1* 2/2015 Kim .................. H01F 38/14
                                              320/108
2016/0056659 A1   2/2016 Ma

* cited by examiner

METHOD FOR MANUFACTURING WIRELESS CHARGING DEVICE

CROSS REFERENCE TO RELATED APPLICATION

This application claims the priority of Taiwanese Patent Application No. 105104082, filed on Feb 5, 2016 in the TIPO (Taiwanese Intellectual Property Office).

TECHNICAL FIELD OF THE INVENTION

The present invention relates to a wireless charging field, and more particularly to a method for manufacturing a wireless charging device.

BACKGROUND OF THE INVENTION

Wireless charging, which is also called non-contact inductive charging, transfers energy from a charging device to an electronic device (to be charged) in an inductive coupling method. The electronic device charges a battery therein after the electronic device receives the energy. The energy is transferred from the charging device to the electronic device in the inductive coupling method. A connection cable is not required between the charging device and the electronic device. As a result, the wireless charging is more convenient than charging with a cable.

In a conventional wireless charging device comprising a coil, the coil is disposed in a slot of a substrate. However, the space of the slot is designed according to the outer shape of the coil for containing the coil. The space is not designed according to each of circles of the coil. Accordingly, the fixity of the coil is poor.

Furthermore, in a conventional wireless charging device comprising a plurality of coils, the coils are stacked on slots of a substrate. However, since the coils cannot be easily bent, the coils cannot be easily assembled when the coils are stacked on the slots of the substrate.

Consequently, there is a need to provide a method for manufacturing a wireless charging device to solve the above-mentioned problems that the fixity of the coil is poor and the coils cannot be easily assembled in the prior art.

SUMMARY OF THE INVENTION

An objective of the present invention is to provide a method for manufacturing a wireless charging device which can solve the above-mentioned problems that the fixity of the coil is poor and the coils cannot be easily assembled in the prior art.

The method for manufacturing the wireless charging device of the present invention comprises: providing a substrate, a first metal plate, and a second metal plate; forming a plurality of circles of slots on the substrate, each of the circles of slots comprising at least one first slot and at least one second slot, the at least one first slot having a first depth, and the at least one second slot having a second depth; forming a first coil and a second coil by performing a metal forming process on the first metal plate and the second metal plate; and placing the first coil in the at least one first slot, and placing the second coil in the at least one second slot.

In one preferred embodiment, after the step of placing the first coil in the at least one first slot, and placing the second coil in the at least one second slot, the method further comprises: disposing a power module on the substrate.

In one preferred embodiment, after the step of disposing the power module on the substrate, the method further comprises: electrically coupling the power module to the first coil and the second coil.

In one preferred embodiment, the first coil has a first terminal, and the second coil has a first terminal. The step of electrically coupling the power module to the first coil and the second coil comprises: electrically coupling the first terminal of the first coil to a first leading-out terminal; electrically coupling the first terminal of the second coil to a second leading-out terminal; and electrically coupling the first leading-out terminal and the second leading-out terminal to the power module.

In one preferred embodiment, the first metal plate comprises a plurality of areas to be removed, and the second metal plate comprises a plurality of areas to be removed. The step of forming the first coil and the second coil by performing the metal forming process on the first metal plate and the second metal plate comprises: forming the first coil by stamping the areas to be removed of the first metal plate in sequence; and forming the second coil by stamping the areas to be removed of the second metal plate in sequence.

In one preferred embodiment, the first coil and the second coil are formed by a metal forming method in which a metal injection molding process is performed on the first metal plate and the second metal plate.

In one preferred embodiment, after the step of placing the first coil in the at least one first slot, the method further comprises: disposing at least one insulating spacer on the first coil.

In one preferred embodiment, the at least one first slot and at least one second slot of each of the circles of slots are alternately disposed.

In one preferred embodiment, the circles of slots are in a spiral shape.

In one preferred embodiment, the first coil and the second coil are in a spiral shape.

In one preferred embodiment, the first coil and the second coil are symmetric with each other.

In one preferred embodiment, the first depth is different from the second depth.

In the method for manufacturing the wireless charging device in accordance with the present invention, since the first coil and the second coil are respectively placed in the slots which have different depths, the first coil and the second coil have good fixity when they are assembled on the substrate. Furthermore, the first coil and the second coil can be modularized, and thus the manufacturing cost of the wireless charging device can be significantly reduced.

DETAILED DESCRIPTION OF THE INVENTION

Figure 1:
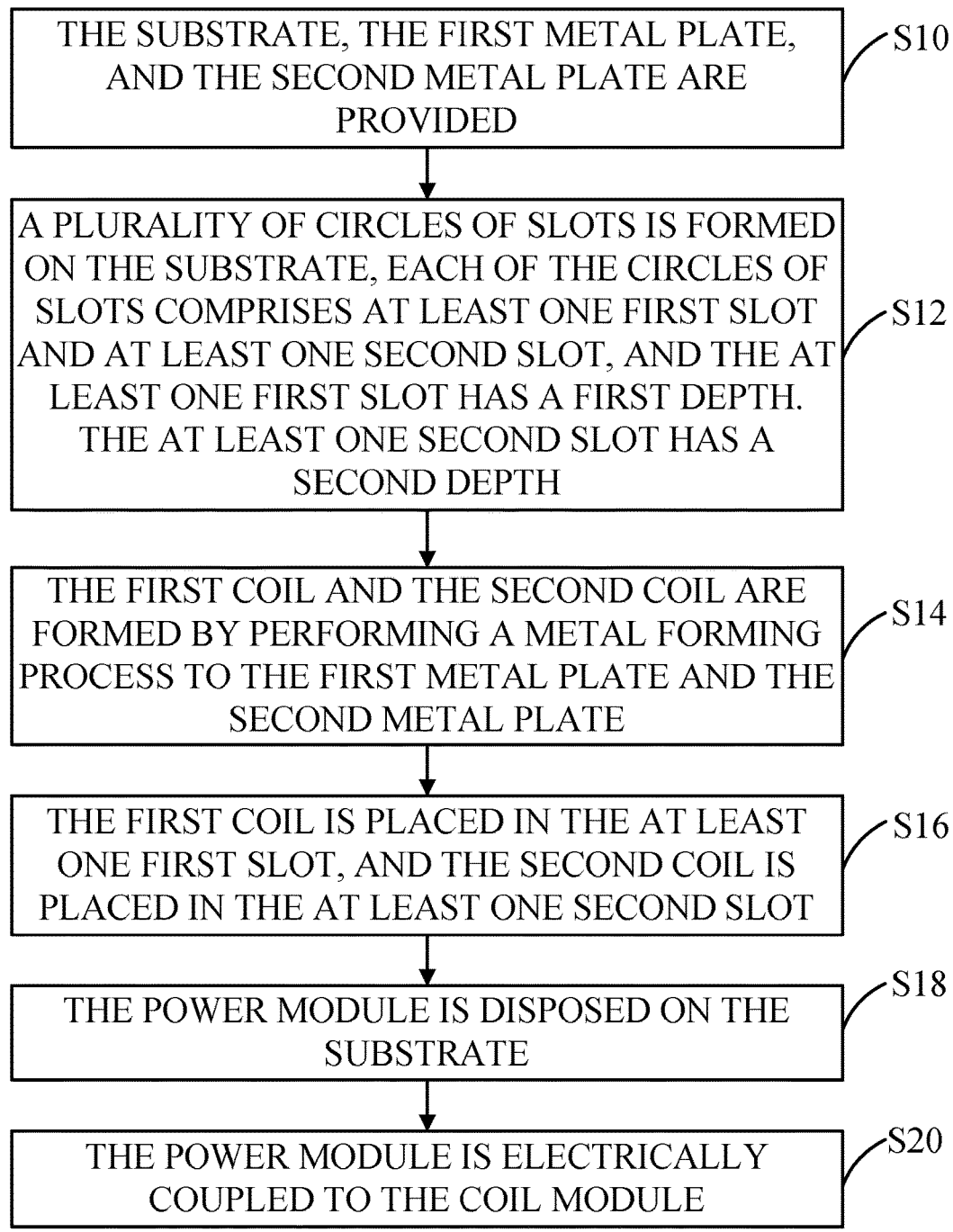
FIG. 1 shows a flowchart of a method for manufacturing a wireless charging device in accordance with an embodiment of the present invention.
Figure 2:
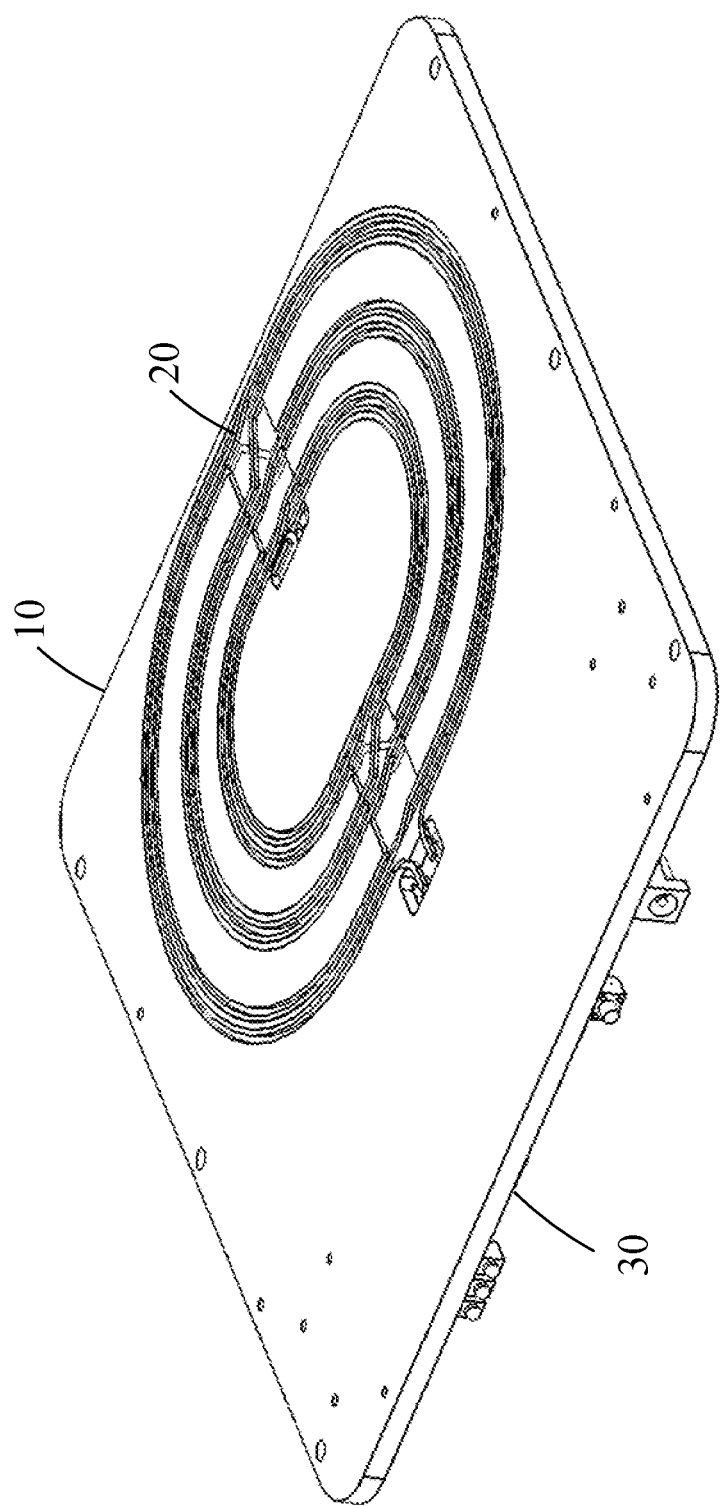
FIG. 2 shows a perspective view of the wireless charging device which is manufactured by the method provided in accordance with the present invention.
Figure 3:
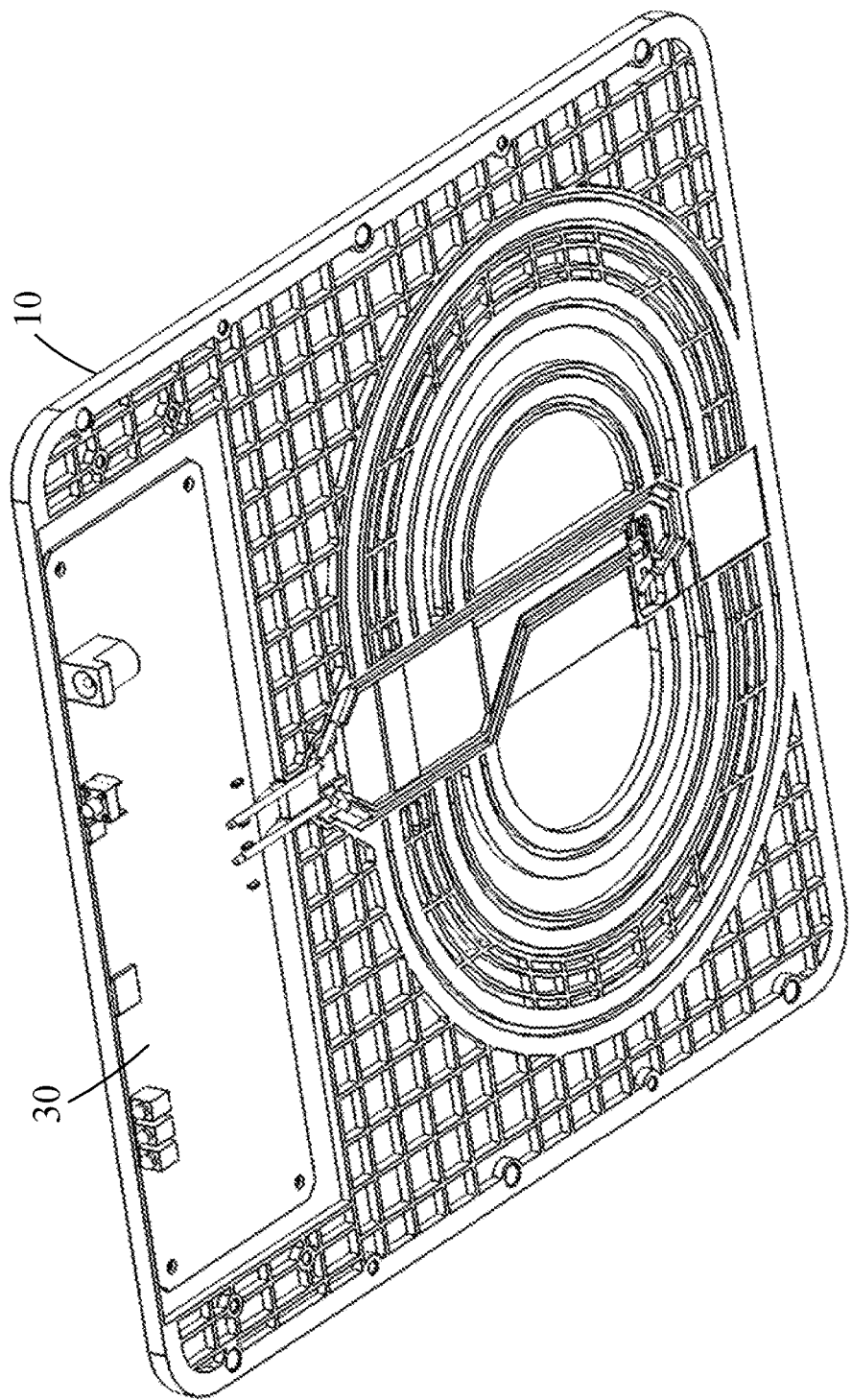
FIG. 3 shows another view of the wireless charging device.

Please refer to FIG. 1 to FIG. 3. FIG. 1 shows a flowchart of a method for manufacturing a wireless charging device in accordance with an embodiment of the present invention. FIG. 2 shows a perspective view of the wireless charging device which is manufactured by the method provided in accordance with the present invention. FIG. 3 shows another view of the wireless charging device.

As shown in FIG. 2 and FIG. 3, the wireless charging device of the present invention mainly comprises a substrate 10, a coil module 20, and a power module 30.

The coil module 20 is disposed on the substrate 10. The power module 30 is disposed on the substrate 10 and electrically coupled to the coil module 20. The power module 30 is utilized for providing power for the coil module 20. In the present embodiment, the coil module 20 and the power module 30 are respectively disposed on two surfaces of the substrate 10. In another embodiment, the coil module 20 and the power module 30 can be disposed on the same surface of the substrate 10.

Figure 4:
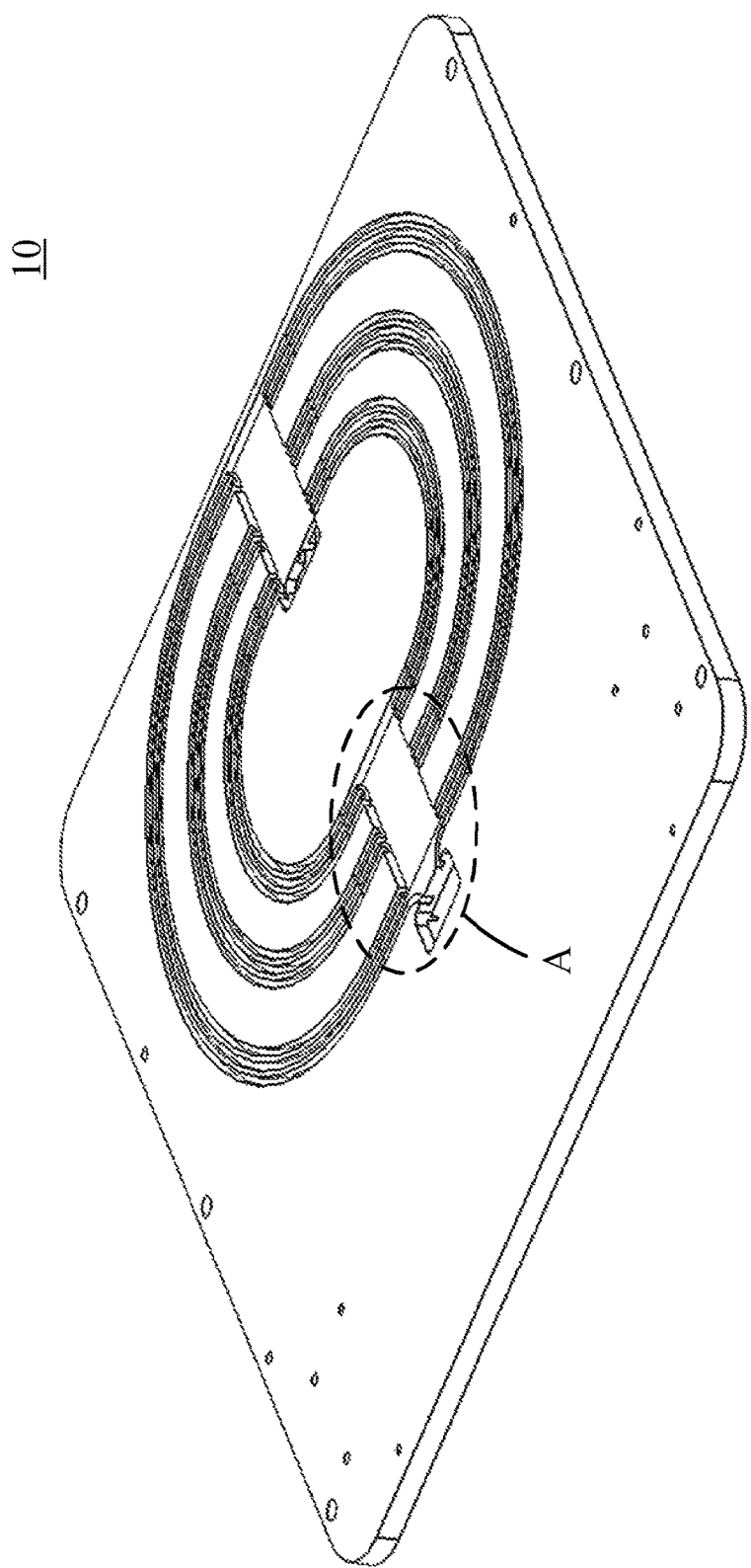
FIG. 4 shows a perspective view of the substrate.
Figure 5:
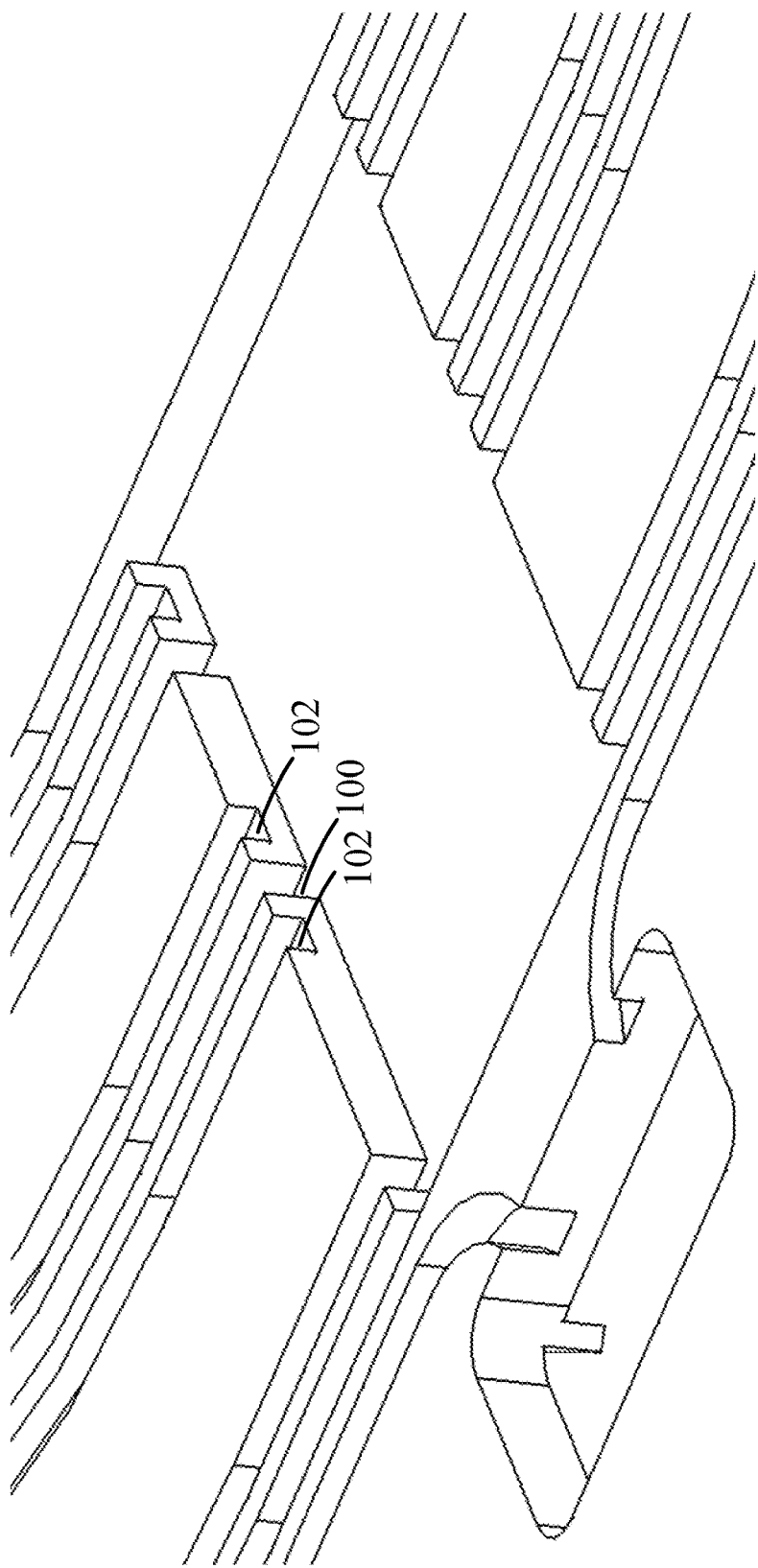
FIG. 5 shows an enlarged view of an area A in FIG. 4.
Figure 6:
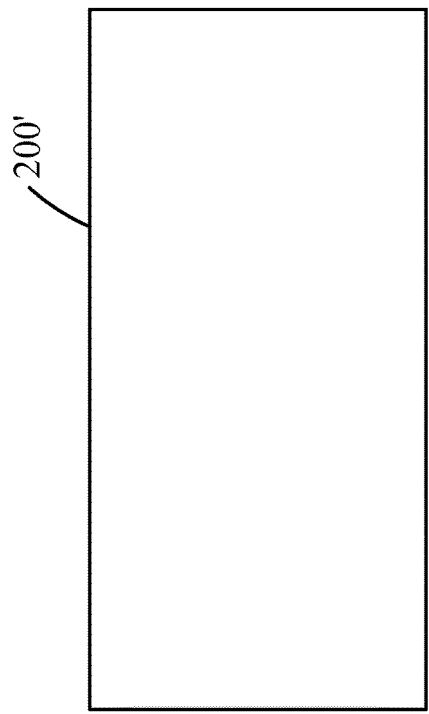
FIG. 6 and FIG. 7 respectively show a first metal plate and a second metal plate.
Figure 7:
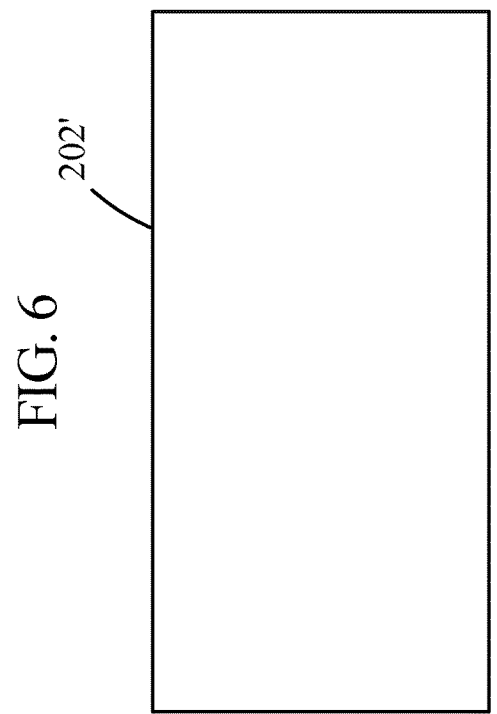
Figure 8:
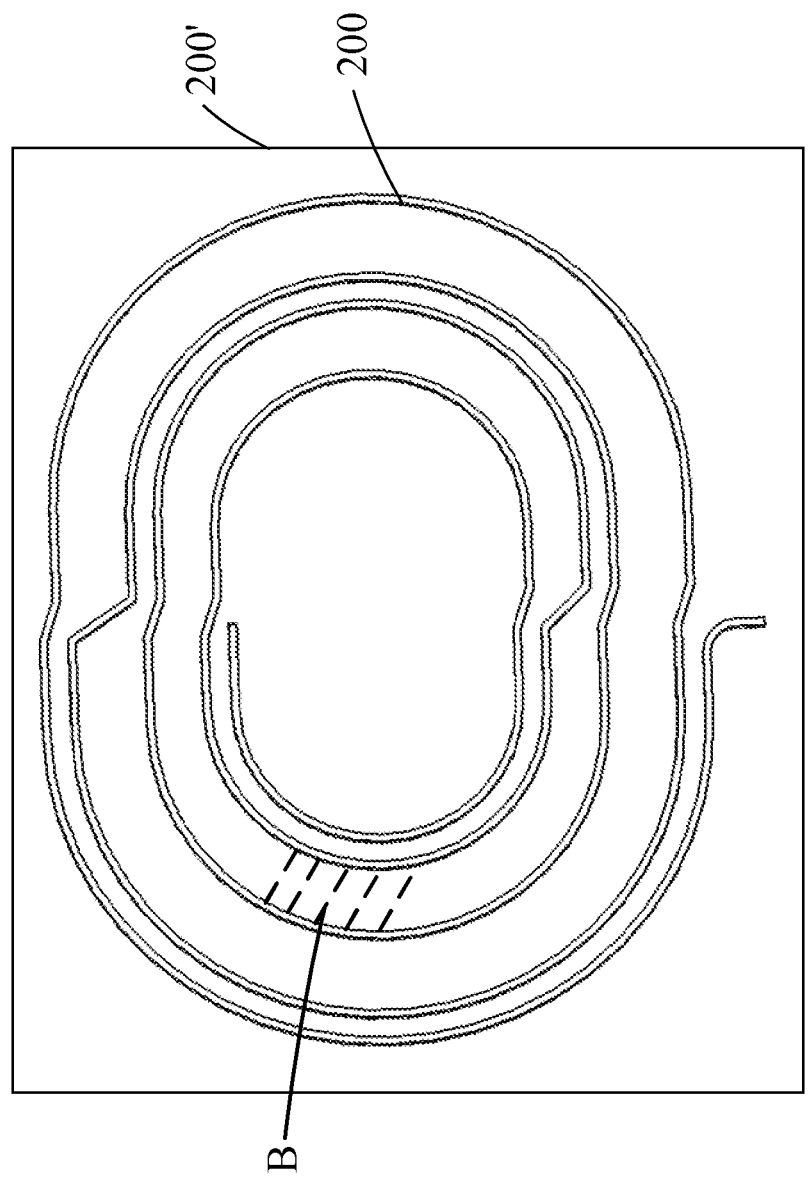
FIG. 8 shows that an area B of the first metal plate is stamped.
Figure 9:
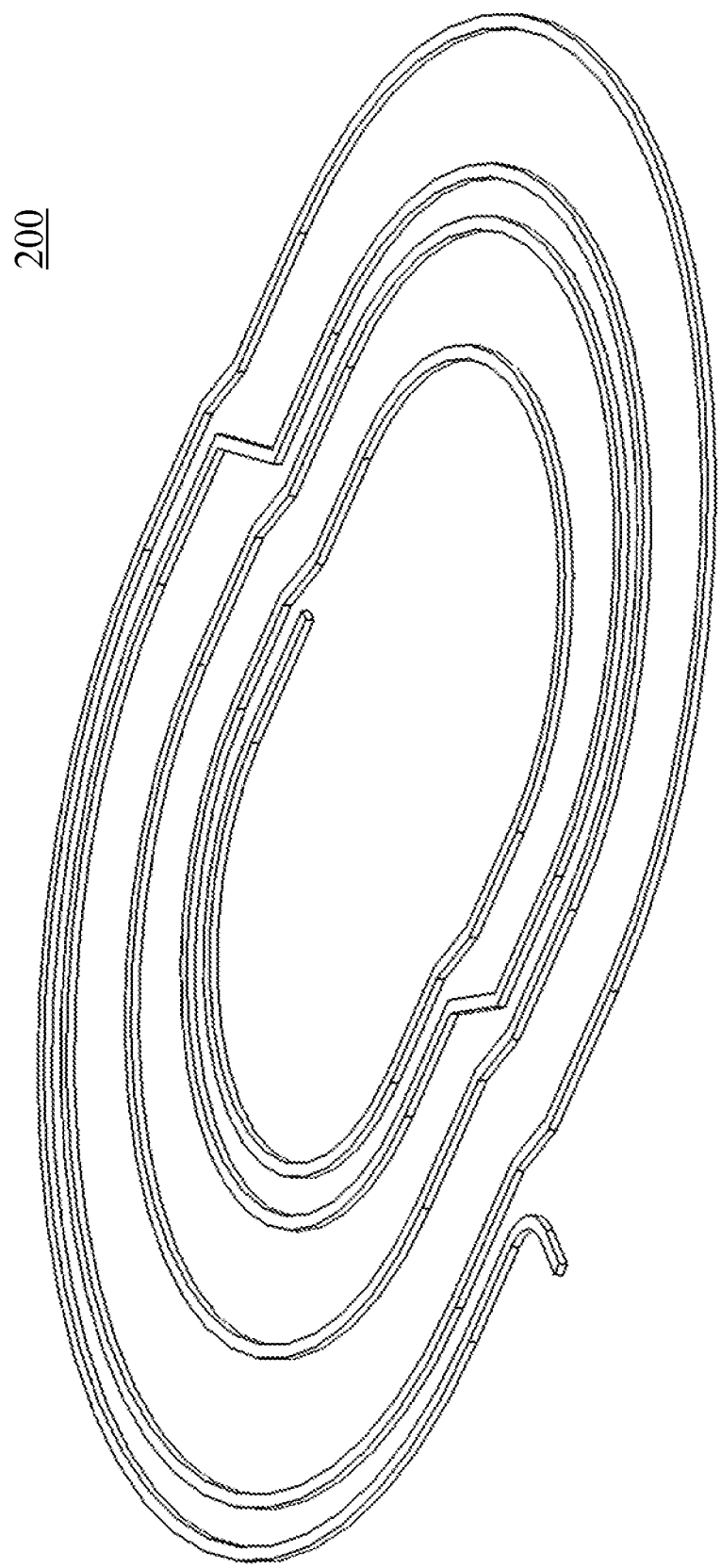
FIG. 9 and FIG. 10 respectively show a first coil and a second coil.
Figure 10:
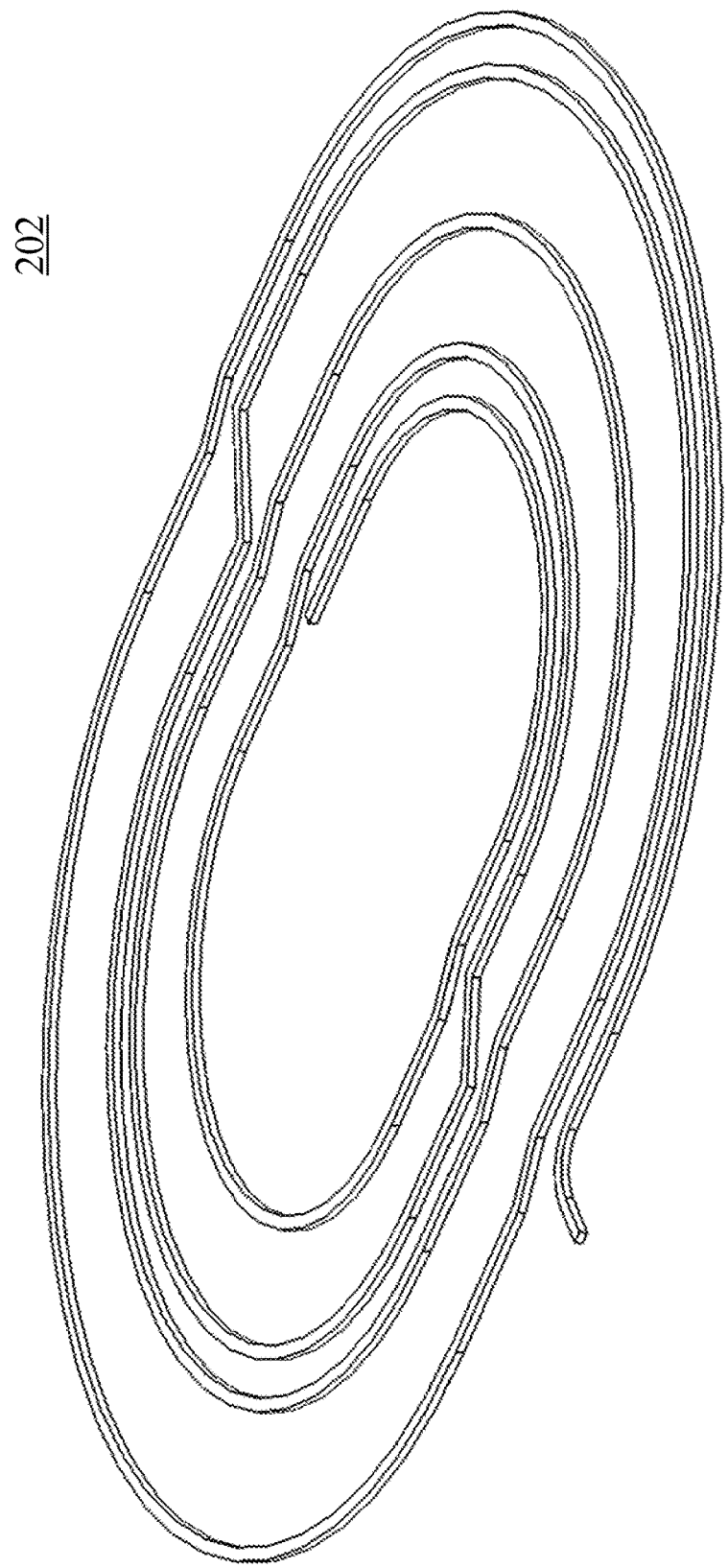

Please refer to FIG. 1 to FIG. 10. FIG. 4 shows a perspective view of the substrate 10. FIG. 5 shows an enlarged view of an area A in FIG. 4. FIG. 6 shows a first metal plate 200'. FIG. 7 shows a second metal plate 202'. FIG. 8 shows that an area B of the first metal plate 200' is stamped. FIG. 9 shows a first coil 200. FIG. 10 shows a second coil 202. The coil module 20 comprises the first coil 200 and the second coil 202.

In step S10, the substrate 10, the first metal plate 200', and the second metal plate 200' are provided.

In step S12, a plurality of circles of slots is formed on the substrate 10. Each of the circles of slots comprises at least one first slot 100 and at least one second slot 102. The at least one first slot 100 has a first depth. The at least one second slot 102 has a second depth. The first depth is different from the second depth. In the embodiment of FIG. 5, the first depth of the at least one first slot 100 is greater than the second depth of the at least one second slot 102.

As shown in FIG. 4, the substrate 10 is in a flat-plate shape and in a substantially rectangular shape. However, the shape of the substrate 10 is not limited thereto. There are there circles of slots formed on the substrate 10. The three circles of slots are in a substantially spiral shape. Furthermore, it can be seen from FIG. 5 that the at least one first slot 100 and the at least one second slot 102 of each of the circles of slots are alternately disposed.

In step S14, the first coil 200 in FIG. 9 and the second coil 202 in FIG. 10 are formed by performing a metal forming process on the first metal plate 200' in FIG. 6 and the second metal plate 202' in FIG. 7. For example, the first coil 200 in FIG. 9 is formed by stamping the first metal plate 200' in FIG. 6, and the second coil 202 in FIG. 10 is formed by stamping the second metal plate 202' in FIG. 7. In one preferred embodiment, the first metal plate 200' and the second metal plate 202' are copper plates. As shown in FIG. 9, the first coil 200 is in a substantially spiral shape. That is, the first metal plate 200' in FIG. 6 is stamped to be the first coil 200 which is in the spiral shape in FIG. 9. For example, the material in the area B in FIG. 8 is removed by stamping the area B. Then, the material in other areas required to be removed is stamped, so that the first coil 200 is in the spiral shape. That is, the first metal plate 200' comprises a plurality of areas to be removed (e.g. the area B). The first coil 200 is formed by stamping these areas to be removed in sequence. The first coil 200 in FIG. 9 is formed after the blank areas in the first metal plate 200' in FIG. 8 are removed.

In the same manner, the second metal plate 202' in FIG. 7 is stamped to be the second coil 202 which is in the spiral shape in FIG. 10. That is, the second metal plate 202' comprises a plurality of areas to be removed. The second coil 202 is formed by stamping these areas to be removed in sequence.

Furthermore, in another embodiment, the first coil 200 and the second coil 202 can be formed by a metal forming method in which a metal injection molding (MIM) process is performed on the first metal plate 200' and the second metal plate 202'.

As shown in FIG. 9 and FIG. 10, the first coil 200 and the second coil 202 are in a substantially spiral shape, and the first coil 200 and the second coil 202 are symmetric with each other. Specifically, the shape of the first coil 200 and the shape of the second coil 202 respectively correspond to the shape of the at least one first slot 100 and the shape of the at least one second slot 102.

Figure 11:
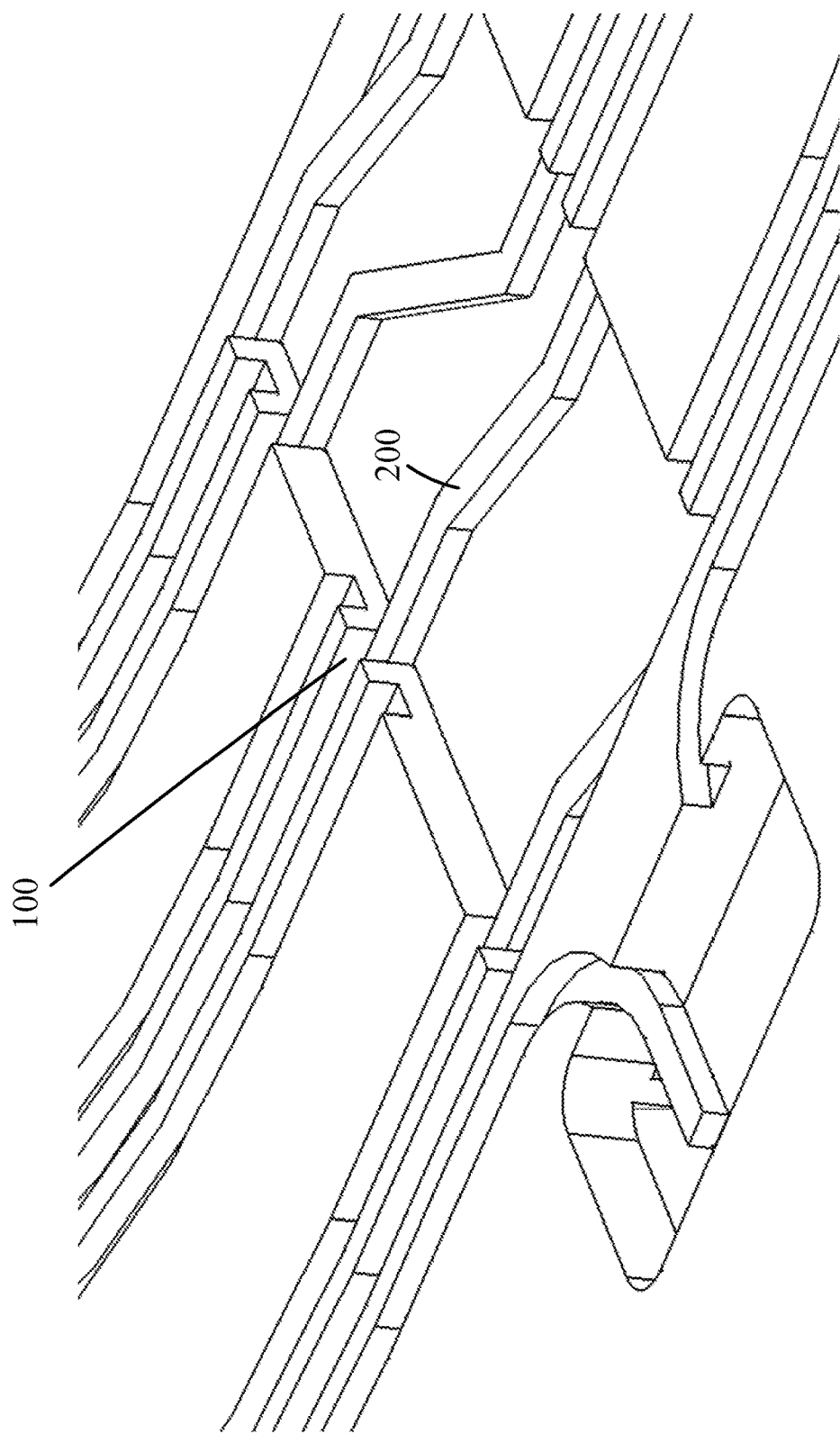
FIG. 11 shows a partial enlarged view in which the first coil is placed in the at least one first slot.
Figure 12:
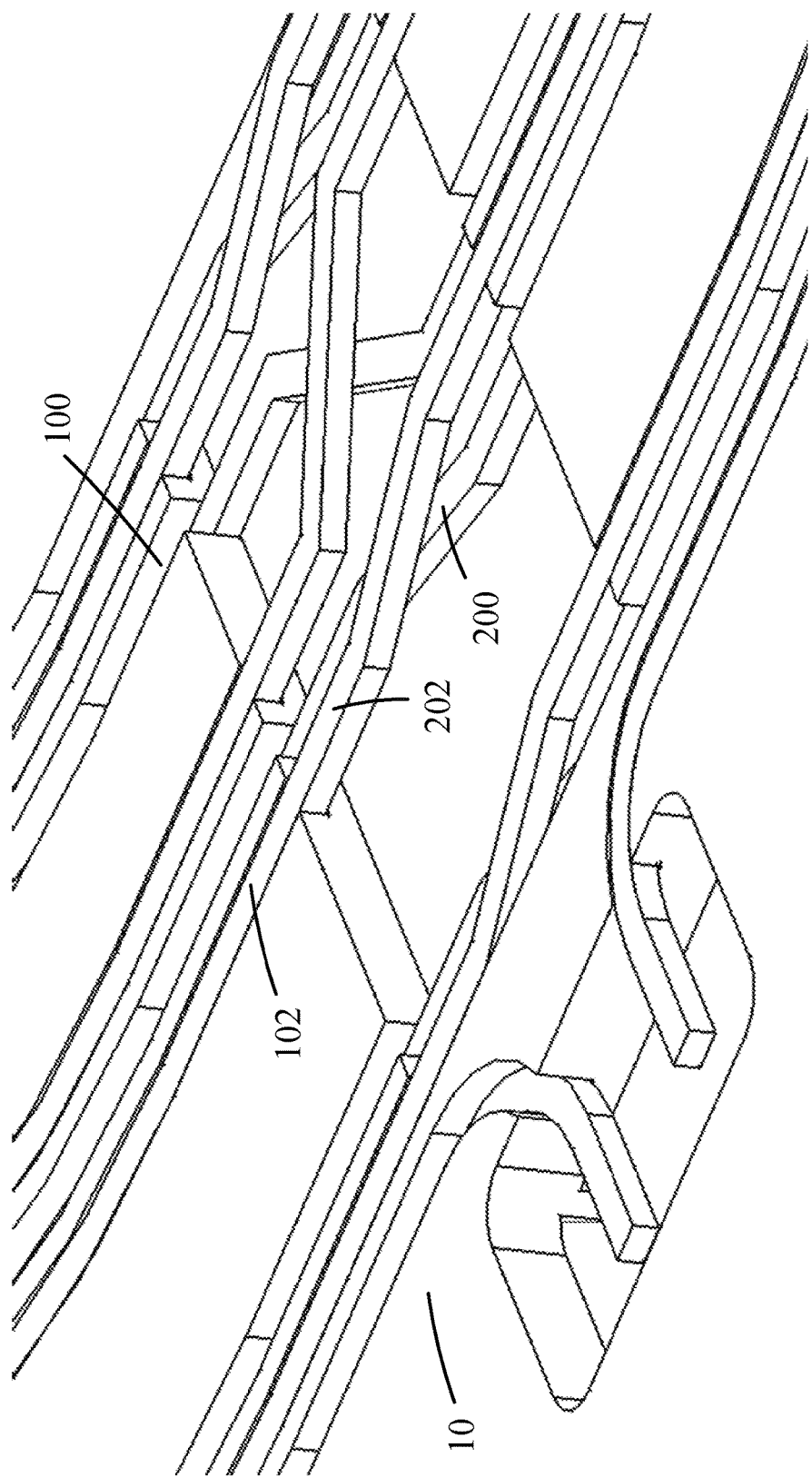
FIG. 12 shows a partial enlarged view in which the first coil and the second coil are placed in the substrate.

Please refer to FIG. 1, FIG. 11, and FIG. 12. FIG. 11 shows a partial enlarged view in which the first coil 200 is placed in the at least one first slot 100. FIG. 12 shows a partial enlarged view in which the first coil 200 and the second coil 202 are placed in the substrate 10.

In step S16, as shown in FIG. 11, the first coil 200 is placed in the at least one first slot 100. Then, as shown in FIG. 12, the second coil 202 is placed in the at least one second slot 102. Since the first coil 200 and the second coil 202 are respectively placed in the at least one first slot 100 and the at least one second slot 102 which have different depths, the first coil 200 and the second coil 202 can be fixedly placed in the substrate 10.

Figure 13:
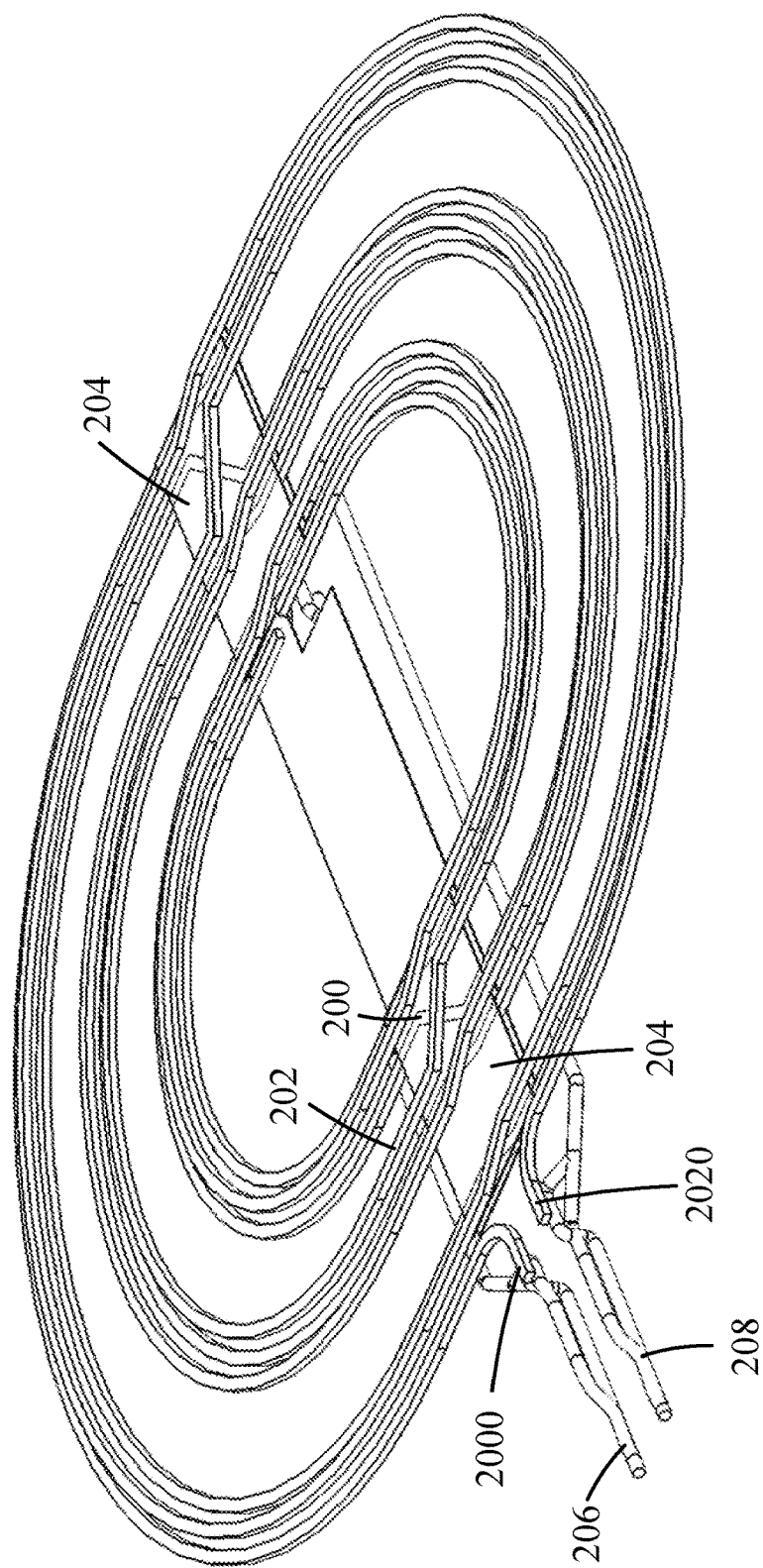
FIG. 13 shows that the coil module further comprises at least one insulating spacer.

Please refer to FIG. 1 and FIG. 13. FIG. 13 shows that the coil module further comprises at least one insulating spacer 204.

In the above-mentioned step S16, after the step of placing the first coil 200 in the at least one first slot 100, the method for manufacturing the wireless charging device in accordance with the present invention further comprises the step of disposing the at least one insulating spacer 204 on the first coil 200. The at least one insulating spacer 204 is disposed between the first coil 200 and the second coil 202, so that the first coil 200 and the second coil 202 are electrically insulated from each other.

Figure 14:
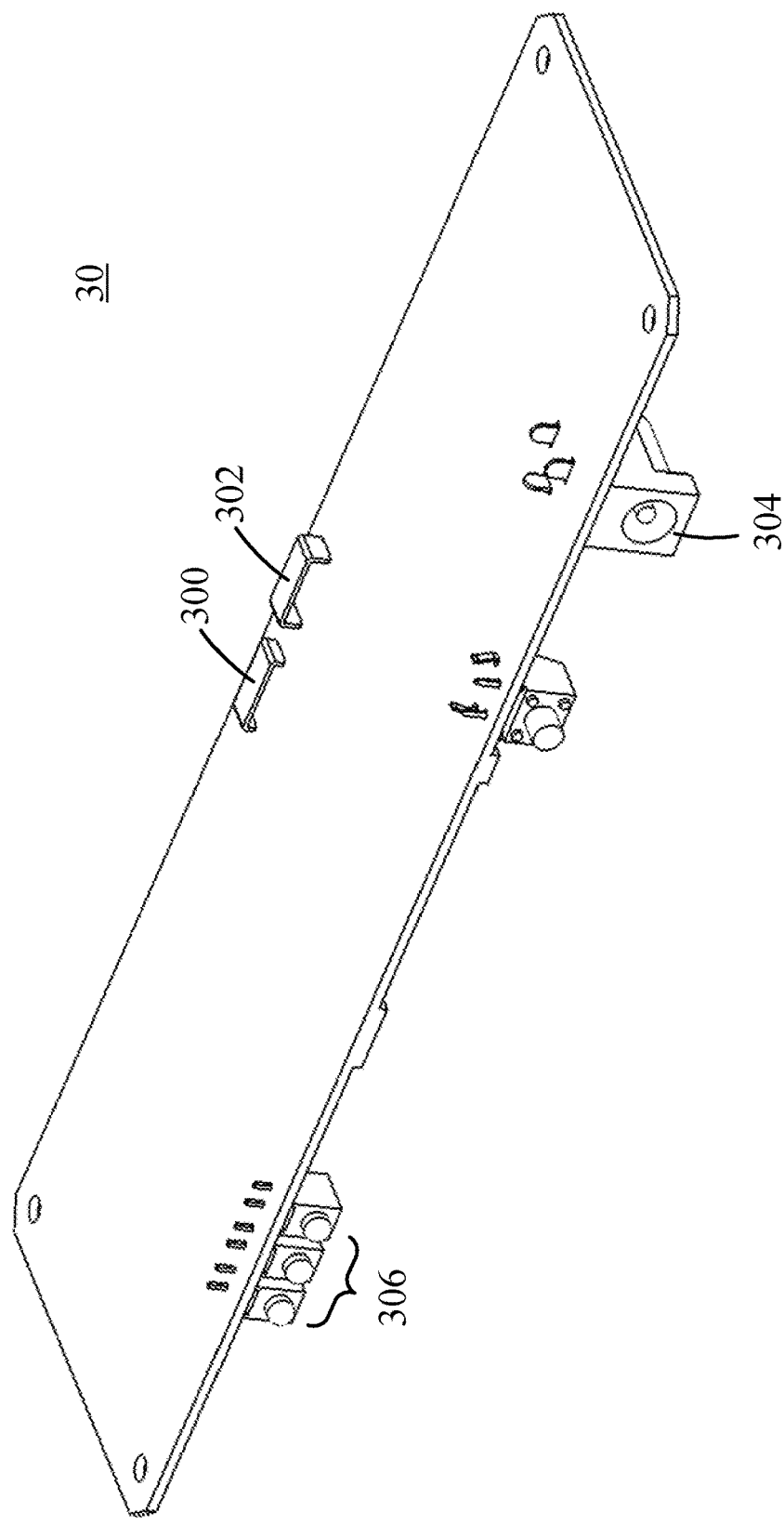
FIG. 14 shows the power module in FIG. 3.

Please refer to FIG. 1 to FIG. 3, FIG. 13, and FIG. 14. FIG. 14 shows the power module 30 in FIG. 3.

In step S18, the power module 30 is disposed on the substrate 10. As mentioned above, the power module 30, the first coil 200, and the second coil 202 can be disposed on the same surface or opposite surfaces of the substrate 10.

In step S20, the power module 30 is electrically coupled to the coil module 20 (that is, electrically coupled to the first coil 200 and the second coil 202). As shown in FIG. 13, the first coil 200 has a first terminal 2000, and the second coil 202 has a first terminal 2020. Step S18 specifically comprises: electrically coupling the first terminal 2000 of the first coil 200 to a first leading-out terminal 206; electrically coupling the first terminal 2020 of the second coil 200 to a second leading-out terminal 208; and electrically coupling the first leading-out terminal 206 and the second leading-out terminal 208 to the power module 30.

When the first coil 200 and the second coil 202 receive power from the power module 30, the first coil 200 and the second coil 202 transfer energy to a device to be charged for charging the device.

As shown in FIG. 14, the power module 30 comprises two terminals 300, 302, a power connector 304, and at least one indicator 306.

The two terminals 300 and 302 are respectively electrically coupled to the first leading-out terminal 206 and the second leading-out terminal 208 in FIG. 10. The power connector 304 is electrically coupled to a power source (not shown) for providing energy which is required when the first coil 200 and the second coil 202 are inductively coupled. The at least one indicator 306 is utilized for indicating a working state of the wireless charging device. For example, the at least one indicator 306 may be a light emitting diode (LED). The at least one indicator 306 which is lit on represents a charging state.

In summary, in the method for manufacturing the wireless charging device in accordance with the present invention, since the first coil and the second coil are respectively placed in the slots which have different depths, the first coil and the second coil have good fixity when they are assembled on the substrate. Furthermore, the first coil and the second coil can be modularized, and thus the manufacturing cost of the wireless charging device can be significantly reduced.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method for manufacturing a wireless charging device, comprising:
   providing a substrate, a first metal plate, and a second metal plate;
   forming a plurality of circles of slots on the substrate, each of the circles of slots comprising at least one first slot and at least one second slot, the at least one first slot having a first depth, and the at least one second slot having a second depth;
   forming a first coil and a second coil by performing a metal forming process on the first metal plate and the second metal plate; and
   placing the first coil in the at least one first slot, disposing at least one insulating spacer on the first coil, and placing the second coil in the at least one second slot.

2. The method for manufacturing the wireless charging device according to claim 1, after the step of placing the first coil in the at least one first slot, and placing the second coil in the at least one second slot, the method further comprising:
   disposing a power module on the substrate.

3. The method for manufacturing the wireless charging device according to claim 2, after the step of disposing the power module on the substrate, the method further comprising:
   electrically coupling the power module to the first coil and the second coil.

4. The method for manufacturing the wireless charging device according to claim 3, wherein the first coil has a first terminal, the second coil has a first terminal, and the step of electrically coupling the power module to the first coil and the second coil comprises:
   electrically coupling the first terminal of the first coil to a first leading-out terminal;
   electrically coupling the first terminal of the second coil to a second leading-out terminal; and
   electrically coupling the first leading-out terminal and the second leading-out terminal to the power module.

5. The method for manufacturing the wireless charging device according to claim 1, wherein the first metal plate comprises a plurality of areas to be removed, the second metal plate comprises a plurality of areas to be removed, and the step of forming the first coil and the second coil by performing the metal forming process on the first metal plate and the second metal plate comprises:
   forming the first coil by stamping the areas to be removed of the first metal plate in sequence; and
   forming the second coil by stamping the areas to be removed of the second metal plate in sequence.

6. The method for manufacturing the wireless charging device according to claim 1, wherein the at least one first slot and at least one second slot of each of the circles of slots are alternately disposed.

7. The method for manufacturing the wireless charging device according to claim 1, wherein the circles of slots are in a spiral shape.

8. The method for manufacturing the wireless charging device according to claim 1, wherein the first coil and the second coil are in a spiral shape.

9. The method for manufacturing the wireless charging device according to claim 8, wherein the first coil and the second coil are symmetric with each other.

10. The method for manufacturing the wireless charging device according to claim 1, wherein the first depth is different from the second depth.

* * * * *